US008384406B2

(12) United States Patent
Watanabe

(10) Patent No.: US 8,384,406 B2
(45) Date of Patent: Feb. 26, 2013

(54) SEMICONDUCTOR TEST APPARATUS AND TEST METHOD

(75) Inventor: Daisuke Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 755 days.

(21) Appl. No.: 12/599,957

(22) PCT Filed: Apr. 14, 2008

(86) PCT No.: PCT/JP2008/000982
§ 371 (c)(1),
(2), (4) Date: Nov. 12, 2009

(87) PCT Pub. No.: WO2009/128114
PCT Pub. Date: Oct. 22, 2009

(65) Prior Publication Data
US 2011/0187400 A1    Aug. 4, 2011

(51) Int. Cl.
*G01R 31/00*    (2006.01)
(52) U.S. Cl. ......... 324/756.07; 324/756.02; 324/750.01; 324/762.01; 714/738; 714/742; 702/118; 702/122
(58) Field of Classification Search ............ 375/224
See application file for complete search history.

(56) References Cited

U.S. PATENT DOCUMENTS

| 7,132,844 | B2 * | 11/2006 | Hashimoto | 324/756.02 |
| 7,174,490 | B2 * | 2/2007 | Evans | 714/724 |
| 7,355,387 | B2 * | 4/2008 | LaBerge | 324/756.02 |
| 7,876,120 | B2 * | 1/2011 | Awaji et al. | 324/750.3 |

FOREIGN PATENT DOCUMENTS

| JP | 3-030528 A | 2/1991 |
| JP | 2007-522782 A | 8/2007 |
| WO | 2005/013573 A1 | 2/2005 |

OTHER PUBLICATIONS

PCT International Preliminary Report on Patentability for PCT Application No. PCT/JP2008/000982 mailed on Oct. 19, 2010, with an English-language translation dated Nov. 30, 2010.

* cited by examiner

Primary Examiner — Richard Isla Rodas
(74) Attorney, Agent, or Firm — Ladas & Parry, LLP

(57) ABSTRACT

In a semiconductor test apparatus, a first device is tested as a device under test in a state where the first device provided with a transmitter transmitting a signal and a second device provided with a receiver receiving the signal transmitted by the transmitter, are connected together. The transmitter includes an equalizer circuit that shapes the waveform of the differential signal to be transmitted. The receiver includes a latch circuit that latches data corresponding to the differential signal thus received with the use of a clock, the timing of which is variable. A control unit varies, in a matrix, a parameter of the equalizer circuit and an edge timing of the clock CLK supplied to the latch circuit.

10 Claims, 9 Drawing Sheets

206a

206b

SEMICONDUCTOR TEST APPARATUS AND TEST METHOD

BACKGROUND OF THE INVENTION

1. Field of the Invention

The present invention relates to a semiconductor test apparatus.

2. Description of the Related Art

In recent years, high-speed serial interfaces have been used in order to realize transmission of large volumes of data between semiconductor devices. As such high-speed serial interfaces, those using signals such as High Definition Multimedia Interface (HDMI) and Low Voltage Differential Signaling (LVDS) capable of transmitting video data and audio data at high speeds, have been in practical use.

In order to test whether a device mounted with a high speed-serial interface normally functions, a test at actual operating frequency (also referred to as an At-Speed test) is performed. The test at actual operating frequency is realized by a method in which a transmitter and a receiver of a high-speed serial interface are connected together through a transmission line on a socket board (also referred to as a performance board). The test is also referred to as a loopback test in the case where the transmitter and the receiver are mounted in the same device, or a back-to-back test in the case where the transmitter and the receiver are mounted in different devices.

Recently, data rates of the high-speed serial interfaces have been sped up to several to ten Gbps or more, and therefore it becomes difficult to ensure an effective timing margin, i.e., eye opening, per bit on the receiver side due to influence of jitter induced by a transmission line loss, causing a problem that the Bit Error Rate (BER) is deteriorated. In order to solve the problem, the high-speed interface is implemented with a waveform equalizing circuit (so-called an equalizing circuit) for compensating the transmission line loss, on either the transmitter side or the receiver side, or on both sides, allowing the compensation for the transmission line loss of several to tens dB or more. In some cases, the compensation amount can be set by a programmable control or a dynamic control.

The equalizing circuit basically serves as a filter for emphasizing a high-frequency component, which is realized by the following method. Any method is the same within the meaning that filtering having an opposite characteristic for compensating a high frequency loss of the transmission line is performed: 1. a method in which a direct current (DC) gain is lowered to relatively raise an alternating current (AC) gain; 2. a method in which the equalizing circuit is structured with a passive device as a peaking circuit; and 3. a method in which a feedback add-control in a bit unit (unit interval unit) is performed by digital signal processing.

In the current loopback test or the back-to-back test, a method is employed in which the transmitter and the receiver are connected together on the socket board with a line, which is as short and of equal length as possible, without performing a test for the equalizing function, such that a Clock and Data Recovery (CDR) link or a source synchronous link is established by a predetermined procedure, and a pass judgment is made when there is not a transmission error for a certain time. Alternatively, a method is sometimes employed in which an eye margin is measured by searching for an effective eye opening by sweeping the clock timing on the receiver side.

When the test for the equalizing function of the high-speed interface circuit is not performed, there is a possibility that the equalizing function may not operate normally in practical use even if the circuit has passed the actual operating frequency test in the loopback test or the back-to-back test. In addition, in the case of the specification in which an equalizing intensity can be set in a programmable way, the equalizing performance corresponding to the setting cannot be obtained in practical use when the linearity of the equalizing intensity is not tested, which can possibly lead to deterioration of the BER.

SUMMARY OF THE INVENTION

In view of these circumstances, the present invention has been made, and a purpose thereof is to provide a method for testing the equalizing function in the loopback test or the back-to-back test and a test apparatus corresponding to the test.

An embodiment of the present invention relates to a method for testing a first device as a device under test in a state where the first device provided with a transmitter transmitting a signal and a second device provided with a receiver receiving the signal transmitted by the transmitter, are connected together. The transmitter includes an equalizer circuit that shapes the waveform of a signal to be transmitted while the receiver includes a latch circuit that latches data corresponding to the signal thus received with the use of a clock, the timing of which is variable. The method executes the following processing (1) to (3) under different test conditions organized as a matrix, i.e., by varying, in a matrix, a parameter of the equalizer circuit and an edge timing of the clock supplied to the latch circuit: (1) a signal corresponding to a pattern sequence is outputted by the transmitter; (2) data corresponding to the signal is latched at the clock edge by the latch circuit; and (3) the data latched by the latch circuit is compared with an expected value corresponding to the pattern sequence.

According to the embodiment, data indicating a comparison result can be acquired in a two-dimensional matrix, allowing various performance of the equalizer circuit in the first device, such as following capability (linearity) for a gain setting value and frequency characteristic, to be verified. The "signal" transmitted or received between the transmitter and the receiver may be a differential signal or a single-end signal. Alternatively, the signal may be an electric signal such as a current signal and a voltage signal, an optical signal or an infrared signal. In addition, the first device and the second device may be the same device or different devices.

The test method according to an embodiment of the present invention may further execute the following processing: (4) pass/fail of the first device is determined based on comparison data indicating a comparison result acquired in a matrix. According to the embodiment, pass/fail of the first device can be determined based on the function of the equalizer circuit, with the use of the comparison data in a matrix.

In the processing (4), the comparison data acquired in a matrix may be compared with expected value data specified in association with the matrix. The expected value data corresponding to the matrix can be generated from a simulation or a measurement result of a good device selected beforehand. By taking the expected value data as an expected value, pass/fail of the first device can be preferably determined.

Another embodiment of the present invention relates to a test apparatus in which a first device is tested as a device under test in a state where the first device provided with a transmitter transmitting a signal and a second device provided with a receiver receiving the signal transmitted by the transmitter, are connected together. The transmitter includes an equalizer circuit that shapes the waveform of a signal to be transmitted while the receiver includes a latch circuit that latches data corresponding to the signal thus received with the use of a clock, the timing of which is variable. The test apparatus comprises: a socket board on which the first device and the second device are mounted; a transmission line that is formed on the socket board and connects the first device and the second device together; a control unit that controls operations of the first device and the second device and makes the latch circuit latch data corresponding to a signal corresponding to a pattern sequence, while the signal is being outputted by the transmitter; and a data acquisition unit that acquires from the second device comparison data indicating a comparison result between the data thus latched and an expected value corresponding to the pattern sequence. The control unit varies, in a matrix, a parameter of the equalizer circuit and an edge timing of a clock supplied to the latch circuit.

The test apparatus according to an embodiment of the present invention may further comprise: a determination unit that determines pass/fail of the first device on the comparison data acquired in a matrix; and an expected value holder that holds expected value data specified in association with the matrix as a determination condition to be referred when the determination unit determines the pass/fail of the first device.

Yet another embodiment of the present invention relates to a method for testing a second device as a device under test in a state where a first device provided with a transmitter transmitting a signal and the second device provided with a receiver receiving the signal transmitted by the transmitter, are connected together. The receiver includes an equalizing circuit that shapes the waveform of the signal thus received and a latch circuit that latches data corresponding to the signal thus received with the use of a clock, the timing of which is variable. The method executes the following processing (5) to (7) by varying, in a matrix, a parameter of the equalizing circuit and an edge timing of the clock supplied to the latch circuit: (5) a signal corresponding to a pattern sequence is outputted by the transmitter: (6) data corresponding to the signal is latched at the clock edge by the latch circuit; and (7) the data latched by the latch circuit is compared with an expected value corresponding to the pattern sequence.

According to the embodiment, data indicating a comparison result can be acquired in a two-dimensional matrix, allowing various performance of the equalizing circuit in the second device, such as following capability (linearity) for a gain setting value and frequency characteristic, to be verified.

The test method according to an embodiment of the present invention may further execute the following processing: (8) pass/fail of the second device is determined based on comparison data indicating a comparison result acquired in a matrix.

In the processing (8), the comparison data acquired in a matrix may be compared with expected value data specified in association with the matrix.

Yet another embodiment of the present invention relates to a test apparatus in which a second device is tested as a device under test in a state where a first device provided with a transmitter transmitting a signal and the second device provided with a receiver receiving the signal transmitted by the transmitter, are connected together. The receiver includes an equalizing circuit that shapes the waveform of the signal thus received and a latch circuit that latches data corresponding to the signal thus received with the use of a clock, the timing of which is variable. The test apparatus comprises: a socket board on which the first device and the second device are mounted; a transmission line that is formed on the socket board and connects the first device and the second device together; a control unit that controls operations of the first device and the second device and makes the latch circuit latch data corresponding to a signal corresponding to a pattern sequence, while the signal is being outputted by the transmitter; and a data acquisition unit that acquires from the second device comparison data indicating a comparison result between the data thus latched and an expected value corresponding to the pattern sequence. The control unit varies, in a matrix, a parameter of the equalizing circuit and an edge timing of a clock supplied to the latch circuit.

The test apparatus may further comprise: a determination unit that determines pass/fail of the second device based on the comparison data acquired in a matrix; and an expected value holder that holds expected value data specified in association with the matrix as a determination condition to be referred when the determination unit determines the pass/fail of the second device.

It is noted that any arbitrary combination of rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
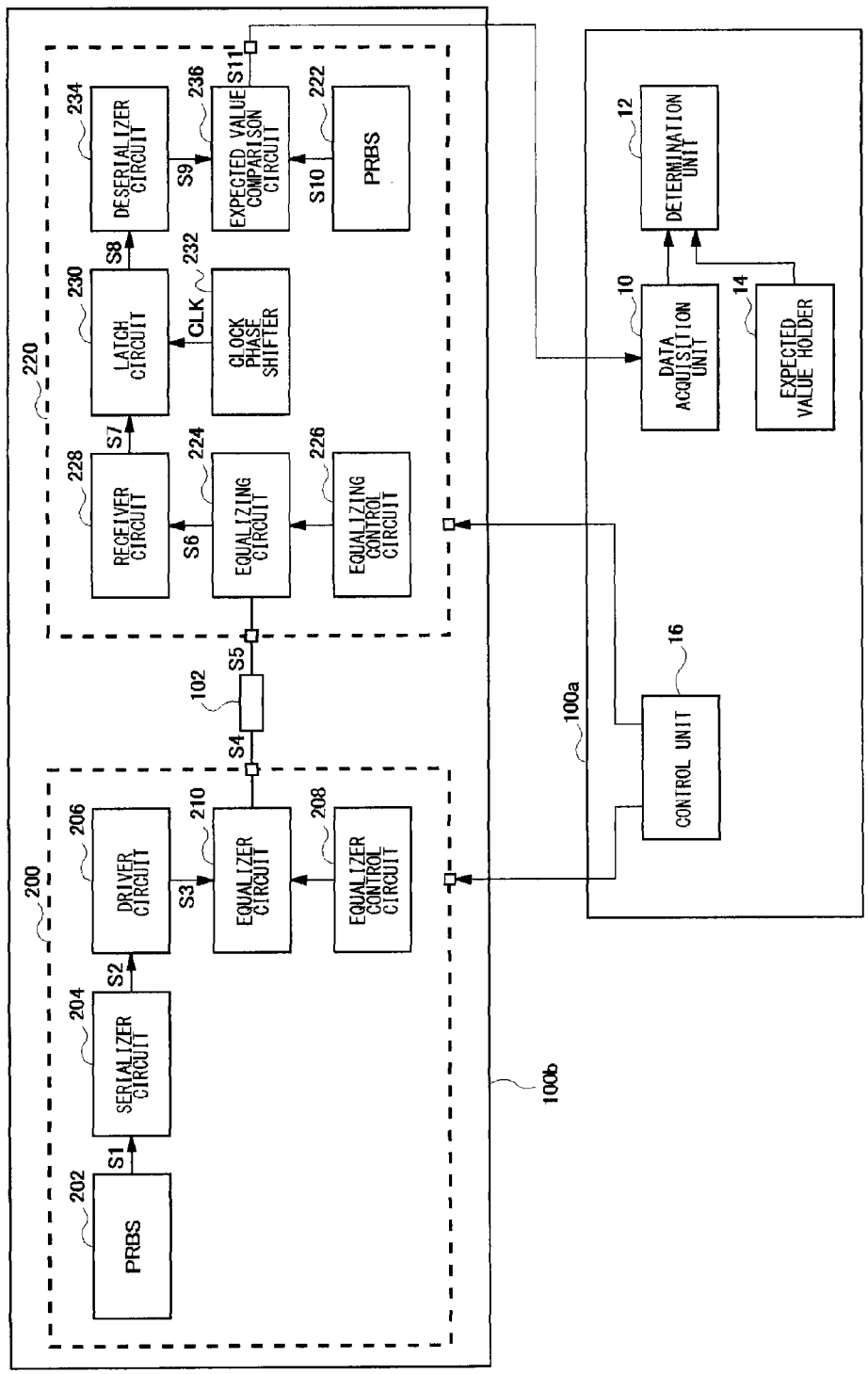
FIG. 1 is a block diagram illustrating the structure of the semiconductor test apparatus according to an embodiment.

The present invention will be described below with reference to the drawings based on the preferred embodiments. The same or equivalent constituting elements, members and processing illustrated in each drawing shall be denoted by the same reference numerals, and the duplicative explanations will be omitted appropriately. The embodiments do not intend to limit the scope of the present invention, but exemplify the invention. All of the features and the combinations thereof described in the embodiments are not necessarily essential to the invention.

Herein, "the state where a member A is connected to a member B" includes not only the state where the member A is physically and directly connected to the member B but also the state where the member A is indirectly connected to the member B via another member that does not affect electrically the connection state between them.

FIG. 1 is a block diagram illustrating the structure of the semiconductor test apparatus 100 according to an embodiment. The semiconductor test apparatus 100 comprises an Automatic Test Equipment (hereinafter, simply referred to as an ATE) 100a and a socket board 100b.

In the semiconductor test apparatus 100 according to the embodiment, either a first device 200 provided with a transmitter transmitting a signal with a differential form (differential signal) or a second device 220 provided with a receiver receiving the differential signal, is tested as a device under test (DUT) between the two. On the socket board 100b, is provided a socket or a probe for mounting the first device 200 and the second device 220. On the socket board 100b, is further formed a transmission line 102 connecting the first device 200 and the second device 220 together. The transmission line 102 preferably exhibits a transmission loss of the same degree as that expected when the first device 200 and the second device 220 are in practical use. This does not necessarily mean that the same transmission length is required, but the transmission line 102 may be formed so as to exhibit a large loss by using a material different from that used when the first and the second devices are in practical use, such that the length of the transmission line 102 is short.

With respect to the tests performed by using the semiconductor test apparatus 100 according to the embodiment, the following three embodiments can be considered, any one of which falls within the scope of the present invention.

(Embodiment 1) Loopback test in which a transmitter and a receiver, which are mounted in the same sample of the same product category, are connected together (i.e., the first device 200 and the second device 220 are the same device);

(Embodiment 2) Back-to-back test in which a transmitter and a receiver, which are mounted in different samples of the same product category, are connected together (i.e., the first device 200 and the second device 220 are devices different from each other); and (Embodiment 3) Back-to-back test in which a transmitter and a receiver, which are mounted in different samples of different product categories, are connected together (i.e., the first device 200 and the second device 220 are devices different from each other).

Before describing the semiconductor test apparatus 100, the description with respect to the first device 200 and the second device 220, which are to be tested, will be made. The case where the first device 200 and the second device 220 are samples different from each other will be described below.

The first device 200 includes a transmitter serving as the transmission side of a high-speed interface. FIG. 1 only illustrates functional blocks associated with the loopback test or the back-to-back test. In addition to the transmitter, digital circuits or analog circuits performing various signal processing are built in, description with respect to which is omitted for simplicity of explanation.

The transmitter of the first device 200 comprises a pseudo-random pattern generating circuit (hereinafter, referred to as a Pseudo Random Binary Sequence (PRBS) generating circuit) 202, a serializer circuit 204, a driver circuit 206, an equalizer control circuit 208, and an equalizer circuit 210.

The PRBS generating circuit 202 generates a pseudo-random bit pattern. A programmable pattern signal may be used instead of the PRBS. The serializer circuit 204 converts the pattern signal S1 outputted by the PRBS generating circuit 202 into a serial-form data signal S2. The driver circuit 206 converts the serial-form data signal S2 into a differential serial signal S3 to output the signal to the transmission line.

The equalizer circuit 210 shapes the waveform of the differential signal S3 to be transmitted and generates a differential serial signal S4.

The equalizer circuit 210 is a pre-emphasis circuit with a function of emphasizing a high-frequency component for compensating the frequency characteristic of the transmission line. As stated later, the equalizer circuit 210 sometimes emphasizes a high-frequency component by relatively lowering a gain of the DC component, which is, in this case, also called a de-emphasis circuit after its method.

The frequency characteristic of the equalizer circuit 210 is structured so as to be variable in multi stages through a parameter such as a gain and a cut-off frequency. The equalizer control circuit 208 controls an adjustable parameter (hereinafter, it is assumed to be a gain) of the equalizer circuit 210.

The structure on the first device 200 side has been described above. Subsequently, the structure of the second device 220 will be described.

The second device 220 includes a receiver serving as the reception side of the high-speed interface. FIG. 1 only illustrates functional blocks associated with the loopback test. In addition to the receiver, digital circuits or analog circuits performing various signal processing are built in, description with respect to which is omitted for simplicity of explanation.

The second device 220 comprises a PRBS generating circuit 222, an equalizing circuit 224, an equalizing control circuit 226, a receiver circuit 228, a latch circuit 230, a clock phase shifter 232, a deserializer circuit 234, and an expected value comparison circuit 236.

To the second device 220, is inputted the differential serial signal S4 outputted from the first device 200 through the transmission line 102. The equalizing circuit 224 receives a differential serial signal S5 transmitted through the transmission line 102, and recovers the waveform of the signal deteriorated during transmission by band correction. In the same way as in the aforementioned equalizer circuit 210, the frequency characteristic of the equalizing circuit 224 is structured so as to be variable in multi stages through a parameter such as a gain and a cut-off frequency. The equalizing control circuit 226 controls the adjustable parameter (hereinafter, it is assumed to be a gain) of the equalizing circuit 224.

The receiver circuit 228 determines the level of a received signal S6 recovered by the equalizing circuit 224 to convert the signal into a binary signal S7 having a high level or a low level.

The clock phase shifter 232 receives a clock CLK having the same frequency as the bit rate of the high-speed serial interface such that the timing of the clock CLK is adjusted to be supplied to the latch circuit 230. The clock phase shifter 232 is structured as part of, for example, a Clock and Data Recovery (CDR) circuit or a source-synchronous circuit. That is, the timing of the clock CLK is automatically adjusted so as to be able to accurately latch each bit of the data S4 in synchronization with the data outputted from the first device 200. The timing of the clock CLK is structured to be adjustable by a setting from outside in addition to such automatic control.

Figure 2:
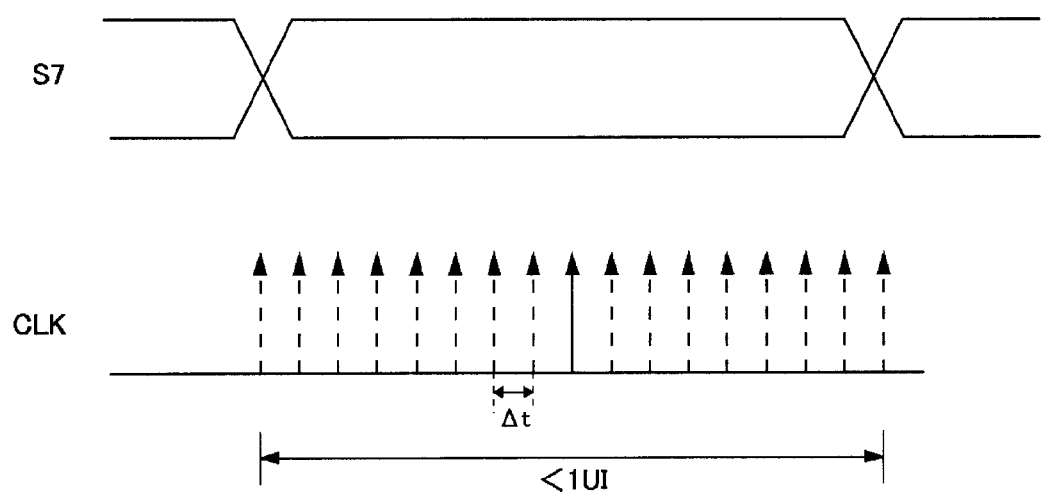
FIG. 2 is time charts illustrating data inputted to a latch circuit and a timing of a clock.

FIG. 2 is time charts illustrating timings of the data S7 inputted to the latch circuit 230 and the clock CLK. The clock phase shifter 232 automatically adjusts the timing of the clock CLK by a link with the CDR method or the source synchronous method, such that the timing is close to the timing near the center of the data illustrated by the continuous line. The timing of the clock CLK can be adjusted by a programmable control from outside so as to fall within a range that is as a whole equal to or more than 1 unit interval (UI), taking the timing illustrated by the continuous line as a reference. Although it is preferable that a time resolution Δt of the clock phase shifter 232 is as high as possible, it is believed that the time resolution of about several ps (e.g., 5 ps) is sufficient for the data rate of about several to 10 Gbps.

Referring back to FIG. 1, the latch circuit 230 latches the binary signal S7 outputted from the receiver circuit 228 by using the edge of the clock CLK, timing of which is adjusted.

The deserializer circuit 234 converts a serial-form signal S8 latched by the latch circuit 230 to a transmission form within the second device 220, for example, parallel-form data S9. The PRBS generating circuit 222 generates the same bit stream S10 as in the PRBS generating circuit 202 on the first device 200 side. To the expected value comparison circuit 236, is inputted the bit stream S10 generated by the PRBS generating circuit 222 as an expected value. The expected value comparison circuit 236 compares the data S9 with the expected value S10 to determine accordance or discordance between the two, and outputs the comparison data S11 in accordance with the comparison result.

The structure of the second device 220 has been described above.

The semiconductor test apparatus 100 according to the embodiment has a function of inspecting an equalizing function provided on the transmitter side or the receiver side, taking the aforementioned first device 200 and second device 220 as devices under test. The structure of the semiconductor test apparatus 100 will be described below.

The ATE 100a comprises a data acquisition unit 10, a determination unit 12, an expected value holder 14, and a control unit 16. The control unit 16 controls operations of the first device 200 and the second device 220 during a test. The control unit 16 makes the transmitter of the first device 200 output the differential signal S4 in accordance with the pattern sequence S1, and, while maintaining the state, makes the latch circuit 230 of the second device 220 latch the data S7 in accordance with the differential signal S5. As a result, the comparison data S11 indicating an comparison result between the latched data S9 and the expected value data S10 is sequentially generated for each bit of the pattern sequence S1, by the expected value comparison circuit 236.

The data acquisition unit 10 of the ATE 100a acquires the comparison data S11 sequentially generated. Alternatively, the data acquisition unit 10 may acquire comparison data indicating accordance or discordance over the whole bits in a predetermined range of the pattern sequence, instead of the comparison data S11 indicating accordance or discordance for each bit of the pattern sequence.

The processing by the ATE 100a in the case of testing the function of the equalizer circuit 210 of the first device 200 differs from that in the case of testing the function of the equalizing circuit 224 of the second device 220. Hereinafter, the description with respect to each case will be made in turn.

(1) In the Case of Testing the Function of the Equalizer Circuit 210 of the First Device 200

In this case, the first device 200 is a DUT while the second device 220 is a reference device. The control unit 16 turns off the function of the equalizing circuit 224 on the second device side 220, or sets the circuit 224 to the gain that is the standard in practical use.

The control unit 16 performs loopback transmission of the differential signal S4, which is in accordance with the sequence pattern, between the first device 200 and the second device 220. In the state, a link is established by the automatic timing adjustment function of the aforementioned clock phase shifter 232 such that the timing of the clock CLK is locked. The control unit 16 shifts the clock by a predetermined width from the state to the timing illustrated by dotted lines in FIG. 2. The data acquisition unit 10 acquires the comparison data S11 at each timing of the clock CLK.

When sweeping the timing of the clock CLK, the comparison data S11 will become a value indicating accordance within a predetermined range centering on the timing position illustrated by the continuous line in FIG. 2, at which the data link is established; and when departing from the range, the comparison data S11 will become a value indicating discordance. That is, an eye opening is measured.

The semiconductor test apparatus 100 according to the embodiment executes a test for measuring the eye opening while varying the gain of the equalizer circuit 210. Namely, the control unit 16 varies the following two parameters in a matrix: 1. the gain of the equalizer circuit 210 of the first device 200; and 2. the edge timing of the clock CLK supplied to the latch circuit 230. As a result, the comparison data S11 is acquired in a matrix for each combination of the two parameters. Alternatively, the timing of the clock CLK and the gain of the equalizer circuit 210 may be automatically controlled by a Built-In Self-Test (BIST) function implemented in the first device 200 and the second devices 220. In this case, the control unit 16 controls the start timing of the BIST.

Figure 3:
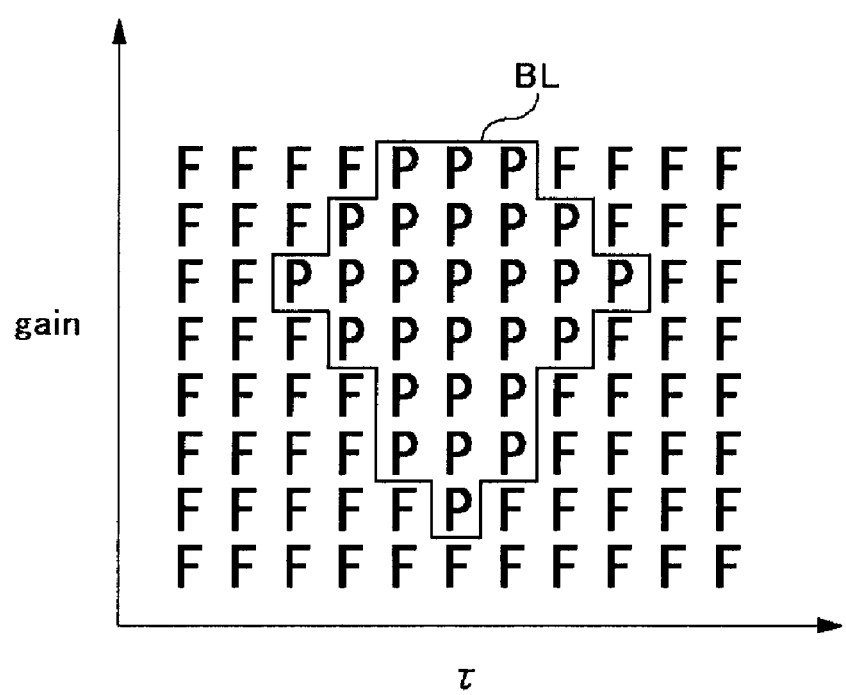
FIG. 3 is a diagram in which comparison data in a matrix are plotted.

FIG. 3 is a diagram in which the comparison data acquired in a matrix (hereinafter, referred to as matrix comparison data) are plotted. In FIG. 3, the horizontal axis represents the timing of the clock CLK while the vertical axis represents the gain of the equalizer circuit 210. FIG. 3 illustrates the case where the gain of the equalizer circuit 210 is switched in eight stages. In the drawing, "P" indicates accordance between the latched data S9 and the expected value S10 while "F" indicates discordance between them. As illustrated in the drawing, when varying the timing of the clock CLK and the gain of the equalizer circuit 210, a region where the data S9 and the expected value S10 accord with each other and a region where they discord with each other, are divided by the boundary line BL illustrated by the continuous line.

When linearity of the gain of the equalizer circuit 210 departs from a design value, the shape of the boundary line BL of the matrix comparison data varies. That is, performance of the equalizer circuit 210 of the first device 200 can be verified by using the matrix comparison data. Characteristics that can be verified include the gain and the cut-off frequency.

For example, the matrix comparison data can also be used for determining whether the first device 200 is good. The determination unit 12 determines whether the first device 200 is good based on the matrix comparison data. In the expected value holder 14, is stored a determination condition in determining whether the device is good by the determination unit 12. The determination condition is specified in association with the matrix illustrated in FIG. 3, and may also be the expected value data indicating, for example, the expected value of the boundary line BL between the accordance region and the discordance region. In this case, the determination unit 12 can determine whether the first device 200 is good based on the degree of divergence between the measured matrix comparison data and the expected value data.

Since the loss of the transmission line 102 is known, the determination condition can be calculated by a simulation using the design value of the equalizer circuit 210. Alternatively, the determination condition may be determined based on a comparison result obtained by measuring the matrix comparison data with respect to the first device 200, which has been determined to be good by another test, instead of the determination condition calculated by the simulation.

(2) In the Case of Testing the Function of the Equalizing Circuit 224 of the Second Device 220

In this case, the second device 220 is a DUT while the first device 200 is a reference device. The control unit 16 turns off the function of the equalizer circuit 210 on the first device 200 side, or sets the circuit 210 to the gain that is the standard in practical use. And in the same way as the case (1), the control unit 16 varies, in a matrix, the gain of the equalizing circuit 224 of the second device 220 and the edge timing of the clock CLK supplied to the latch circuit 230. In this case, the matrix comparison data same as that in FIG. 3 can also be acquired, and performance of the equalizing circuit 224 can be verified based on the data, or pass/fail of the second device 220 can be determined.

When the transmission line 102 has a large loss, the same degree as that in practical use, it can be imagined that clock synchronization by the CDR circuit or the source synchronous circuit is not established if band correction by the equalizer circuit 210 or the equalizing circuit 224 is made a maximum. In such a case, the loopback test with a clock operating at half-rate has only to be performed. If the data rate is lowered to the degree in which synchronization of the clock and data is possible, the equalizing function can be measured over its full range. This is a measurement using the fact that the transmission line loss is a linear phenomenon.

In the aforementioned embodiment, the case (back-to-back) where the first device 200 and the second device 220 are mounted in different devices has been described. By mounting the first device 200 and the second device 220 in different devices, there is an advantage that a sample excellent in its characteristic can be selected as a reference device. That is, when verifying the characteristic of the equalizer circuit 210 on the transmitter side, the equalizer circuit 210 cannot be accurately verified if the performance on the second device 220 side is deteriorated; however, this problem can be solved when the first device 200 and the second device 220 are mounted in different devices.

However, the first device 200 and the second device 220 may be mounted in the same device. That is, the same test can be performed when a transmitter and a receiver, which are mounted in a single device, are connected together in loop in a self-contained manner (loopback test).

Figure 4A:
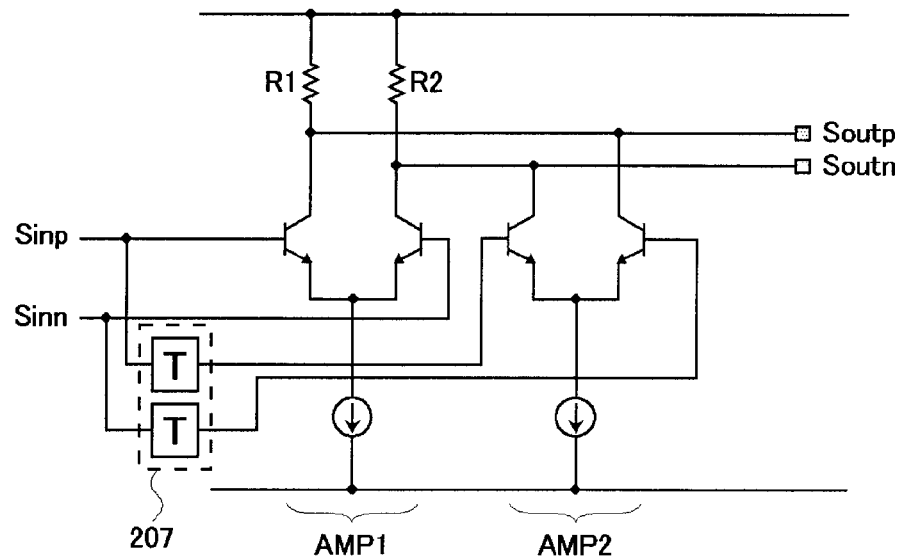
FIGS. 4A and 4B are circuit diagrams illustrating examples of the structure of a driver circuit having an equalizing function.
Figure 4B:
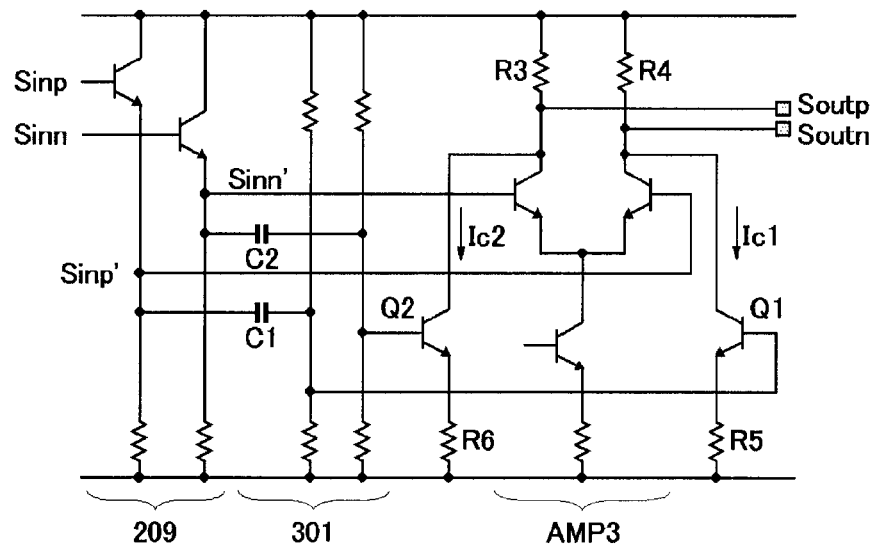

Subsequently, a technique for verifying the function of the equalizer circuit 210 of the first device 200 by using an approach different from the back-to-back test and the loopback test, will be described. FIGS. 4A and 4B are circuit diagrams illustrating examples of the structure of the driver circuit having an equalizing function. In order to realize high-speed switching of several Gbps or more, either of the driver circuit 206a or the driver circuit 206b is structured in a Current Mode Logic (CML) form. The driver circuits 206a and 206b in FIGS. 4A and 4B are structured by integratedly forming in the CML form the driver circuit 206 and the equalizer circuit 210 in FIG. 1.

In the CML form, the high level of the potential is equal to a power supply voltage Vdd, and therefore a peaking waveform having a potential higher than the power supply voltage Vdd cannot be generated in principle by equalizing. Accordingly, de-emphasis is generally performed in which the AC gain is relatively raised by lowering the DC gain.

The driver circuit 206a in FIG. 4A comprises a main differential amplifier AMP1 and a sub-differential amplifier AMP2, which have a pair of output load resistances R1 and R2 as loads common between them. To the main differential amplifier AMP1, are inputted differential input signals Sinp and Sinn. A delay circuit 207 delays the differential input signals Sinp and Sinn by one cycle time T. The input signals Sinp' and Sinn' thus delayed are inputted to the sub-differential amplifier AMP2.

The main differential amplifier AMP1 and the sub-differential amplifier AMP2 are connected in an opposite phase relative to the pair of the output load resistances R1 and R2. According to the driver circuit 206a in FIG. 4A, a waveform, high-frequency component of which is emphasized by lowering the DC gain, can be generated by inverting the data delayed by one cycle and by adding the data to the original one.

In the driver circuit 206a in FIG. 4A, the gain of the equalizer circuit can be set by switching a tail current of the sub-differential amplifier AMP2.

The driver circuit 206b in FIG. 4B comprises a differential amplifier AMP3 having a pair of output load resistances R3 and R4 as loads. The differential input signals Sinp and Sinn are shifted by one Vf (Vf is a forward voltage between base and emitter of a bipolar transistor) to the lower potential side by an emitter-follower circuit 209 mounted in the first stage, and inputted to the differential amplifier AMP3.

DC components of the differential input signals Sinp' and Sinn' thus shifted to the lower potential side are eliminated by a filter 301 including capacitors C1 and C2, which are provided in series, such that only AC components are supplied to the bases of transistors Q1 and Q2. The collector of the transistor Q1 is connected to an output resistance R4 while that of the transistor Q2 is connected to an output resistance R3. In the driver circuit 206 in FIG. 4B, a waveform, high-frequency component of which is emphasized by superimposing the AC component on the original signal at a level transition timing, is generated.

In the driver circuit 206b in FIG. 4B, the gain of the equalizer circuit is set by collector currents Ic1 and Ic2 flowing in the transistors Q1 and Q2. The collector currents Ic1 and Ic2 can be adjusted by structuring respectively either of the transistors Q1 and Q2 so as to be segmented such that effective transistor sizes are varied or resistance values of resistances R5 and R6, which are to be connected to either emitter of the transistors Q1 and Q2, can be variable.

When inspecting the equalizing function in FIGS. 4A and 4B, it is preferable that an AC test is performed by the test at actual operating frequency with the use of the semiconductor test apparatus 100 in FIG. 1; however, the linearity of the equalizing function can be simply verified by a DC test as stated below.

Figure 5:
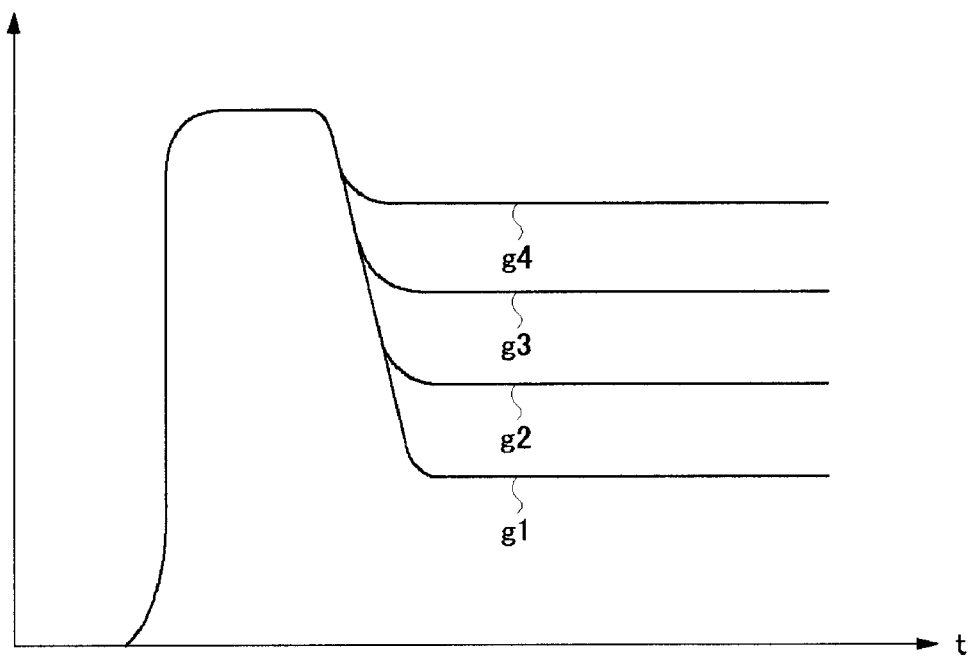
FIG. 5 is a diagram illustrating a time waveform of an output voltage of the driver circuit in FIG. 4B.

FIG. 5 is a diagram illustrating time waveforms of an output voltage of the driver circuit 206b in FIG. 4B. FIG. 5 illustrates four waveforms g1 to g4, equalizing gains of which are different from each other. An amount of the equalizing gain is equal to an amount of the de-emphasis, that is, the amount of the equalizing gain corresponds one-to-one with a value of a DC amplitude in a steady state. The same is true for the driver circuit 206a in FIG. 4A.

Accordingly, the amount of equalizing can be indirectly measured by measuring potentials of the differential output signals Soutp and Soutn with the use of a voltmeter of the semiconductor test apparatus. It is because the sub-differential amplifier AMP2 in FIG. 4A and the transistors Q1 and Q2 in FIG. 4B are mere variable amplitude drivers in terms of AC, and the amount of equalizing as the driver circuits 206a and 206 is determined by an magnitude of the DC gain. Therefore, the linearity of the equalizing function can be tested by measuring the DC amplitude with the use of a voltmeter, allowing the linearity between the setting value in practical use and the amount of equalizing to be ensured.

When a tail current source on the main differential amplifier side in FIGS. 4A and 4B, is structured to be programmable, a voltage margin can be measured by varying, in a matrix, the tail current of the main differential amplifier, instead of or in conjunction with measuring a timing margin by varying the timing of the clock CLK of the latch circuit 30 in the receiver. If the DC output amplitude for each amount of equalizing is measured beforehand by the aforementioned DC test, it is possible that the loopback test is performed by setting the DC output amplitude inherent for each DUT. Further, the voltage margin test at an actual operation can be performed by lowering the tail current of the main differential amplifier.

Figure 6:
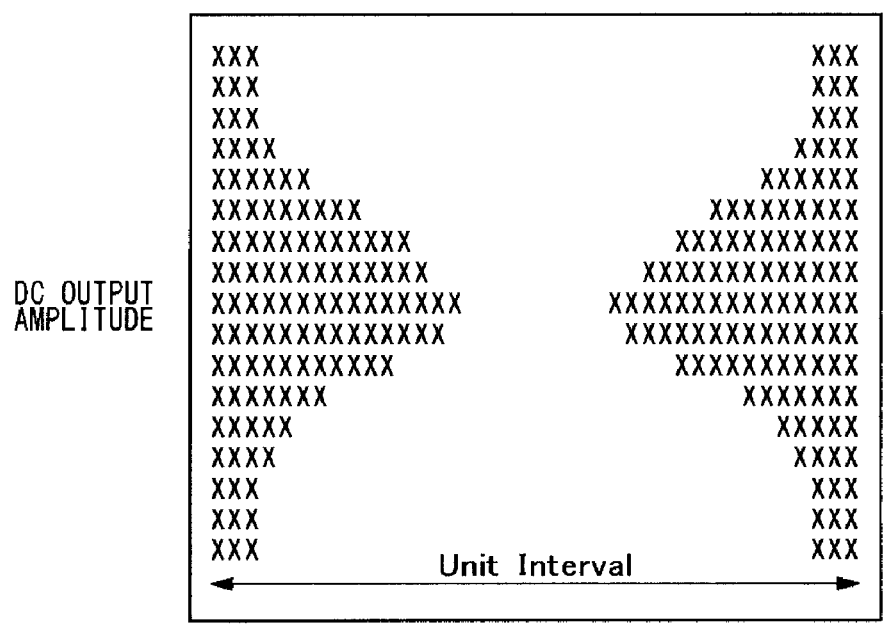
FIG. 6 is a diagram illustrating matrix comparison data acquired with a DC output amplitude corresponding to a tail current of a main differential amplifier, and a timing of a clock supplied to a latch circuit, being parameters.

FIG. 6 is a diagram illustrating matrix comparison data acquired by taking the DC output amplitude corresponding to the tail current of the main differential amplifier and the timing of the clock CLK supplied to the latch circuit 230, as parameters. "X" in the drawing corresponds to "P" in FIG. 3. By using this test method, an SHMOO plot having a hourglass shape as illustrated in FIG. 6 can be obtained.

The description has been made with reference to the present invention based on the embodiments. The embodiments have been described for exemplary purposes only and it can be readily conceived by those skilled in the art that various variations may be made by making various combinations of the aforementioned components or processes, which are also encompassed in the scope of the present invention. Such variations will be described below.

In the embodiments, the case where the first device 200 and the second device 220 communicate with each other by using a differential serial signal has been described; however, the signal may be a single-end signal. Further, the present invention is also applicable to an electric signal such as a voltage signal and a current signal as well as an optical signal.

Figure 7:
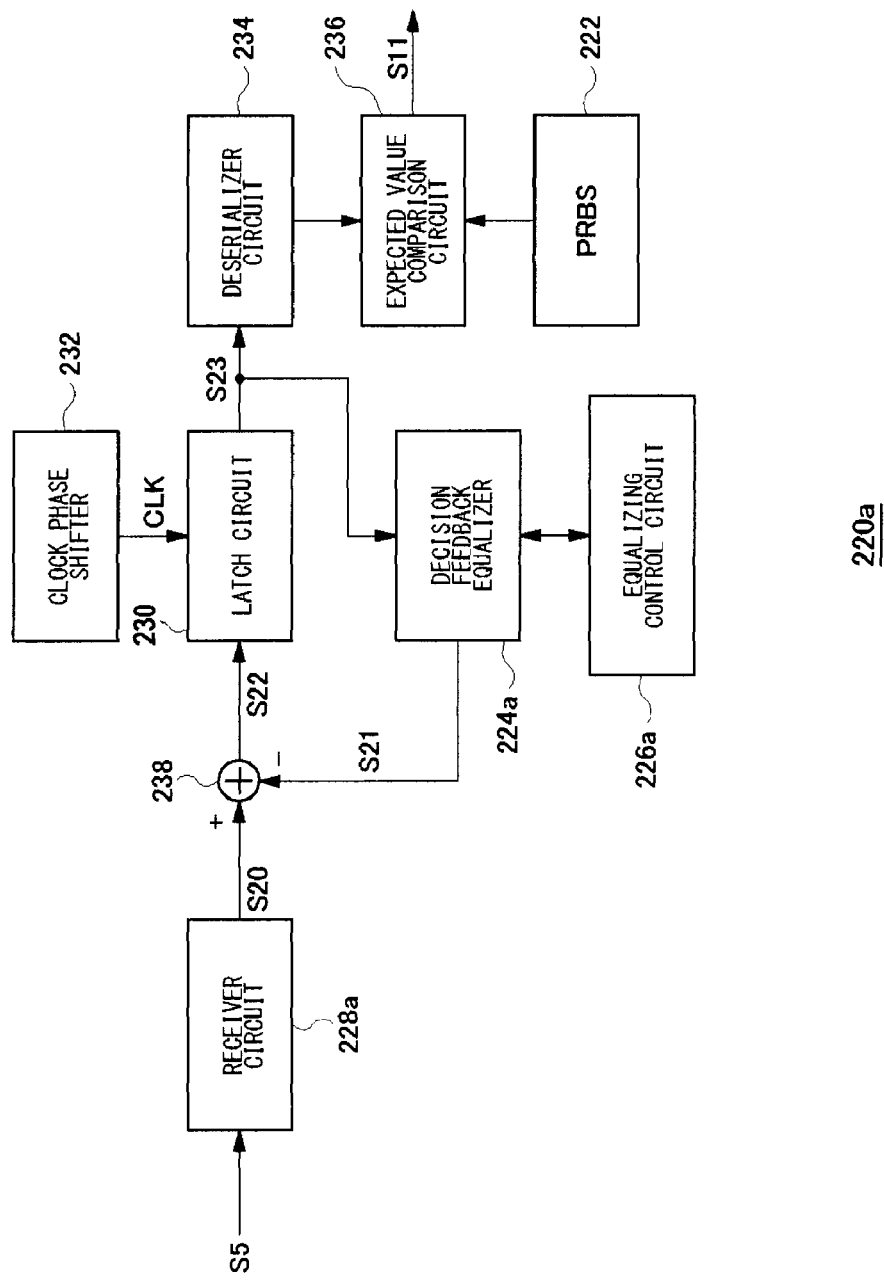
FIG. 7 is a circuit diagram illustrating a variation of a second device provided with a receiver.

A variation of the second device 220 will be described. FIG. 7 is a circuit diagram illustrating a variation of the second device provided with a receiver. The second device 220a according to this variation has a function of correcting an amount of equalizing by performing a feedback control. The second device 220a comprises: a PRBS generating circuit 222, a decision feedback equalizer 224a, an equalizing control circuit 226a, a receiver circuit 228a, a latch circuit 230, a clock phase shifter 232, a deserializer circuit 234, an expected value comparison circuit 236, and an adder 238.

After receiving a differential signal S5, the receiver circuit 228a converts the signal into a single-end received signal S20. The decision feedback equalizer 224a generates an analog correction signal S21, voltage level of which varies with time. The adder 238 subtracts the correction signal S21 from the received signal S20 in an analog manner and generates the equalized received signal S22. The latch circuit 230 latches the signal S22 with the use of a clock CLK generated by the clock phase shifter 232.

The decision feedback equalizer 224a generates the correction signal S21 with the use of the data S23 thus latched. The equalizing control circuit 226a controls the decision feedback equalizer 224a to control the correction signal S21. The processing after the latch circuit 230 is the same as in FIG. 1.

Figure 8:
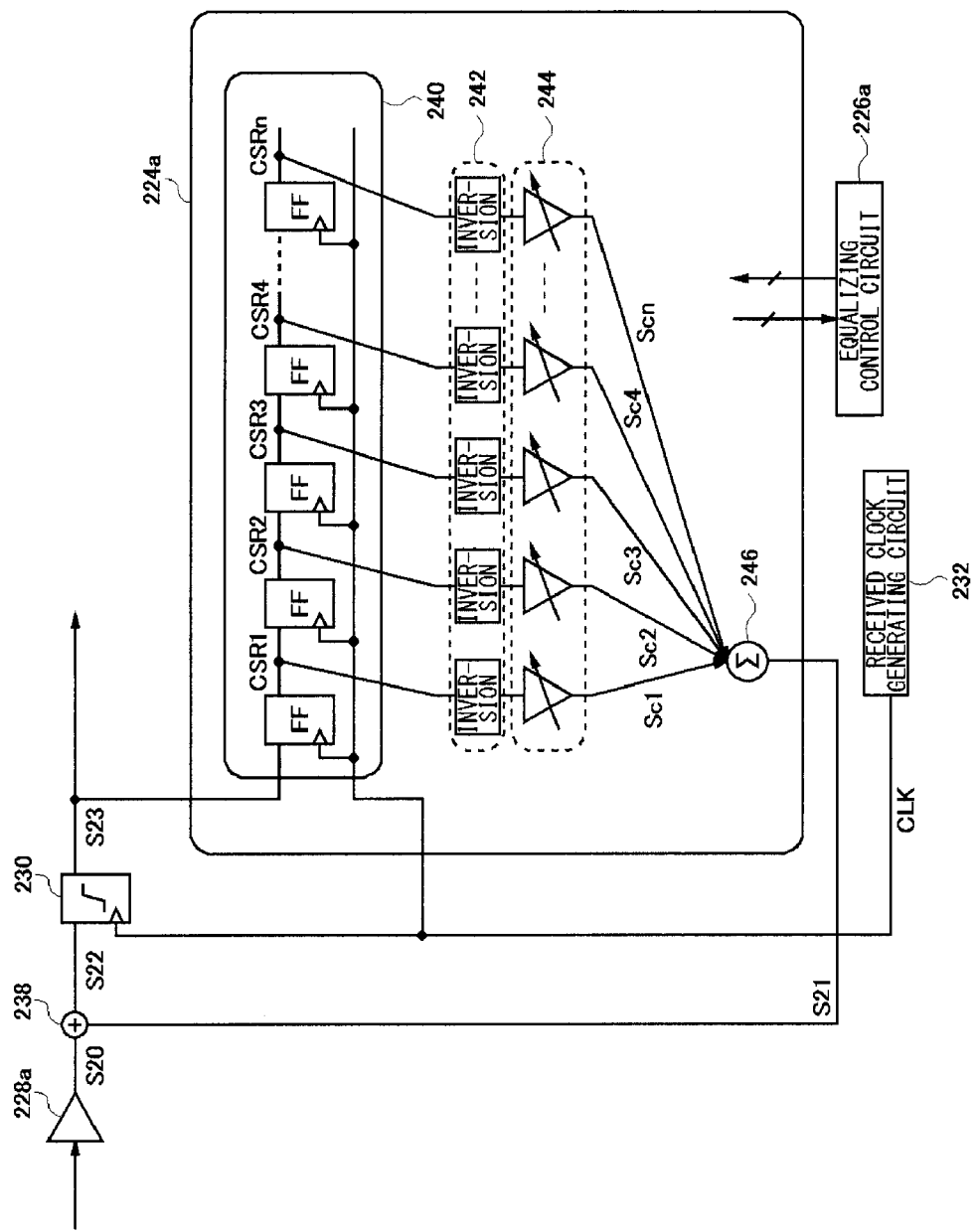
FIG. 8 is a block diagram illustrating the detailed structure of the decision feedback equalizer in FIG. 7.

FIG. 8 is a block diagram illustrating the detailed structure of the decision feedback equalizer 224a in FIG. 7. The decision feedback equalizer 224a includes a shift register 240, a code control circuit 242, a weighting arithmetic circuit 244, and a waveform adding circuit 246.

After receiving the data S23 thus latched by the latch circuit 230, the shift register 240 shifts the data S23 by 1 bit for each clock CLK in terms of time. Alternatively, the shift register 240 may include a plurality of flip-flops FF that are cascade-connected with each other. An output from the flip-flop in the first stage is referred to as a cursor signal CSR1 while outputs from flip-flops in the second stage or later are referred to as precursor signals CSR2 to CSRn.

The cursor signal CSR1 and the precursor signals CSR2 to CSRn outputted from the respective flip-flops FF are outputted to the code control circuit 242. The code control circuit 242 inverts the cursor signal and the precursor signals independently from each other, or outputs those signals as they are non-inverted. Whether the code control circuit 242 is inverted is controlled by the equalizing control circuit 226a.

The weighting arithmetic circuit 244 includes a variable amplifier provided for each of a plurality of data items outputted from the code control circuit 242. After multiplying inputted signal by a predetermined coefficient in an analog manner, each variable amplifier outputs the signals. The coefficient of each variable amplifier is controlled by the equalizing control circuit 226. The waveform adding circuit 246 subjects a plurality of analog signals Sc1 to Scn outputted from the weighting arithmetic circuit 244 to additive synthesis, and outputs the signal thus synthesized as the correction signal S21.

Figure 9:
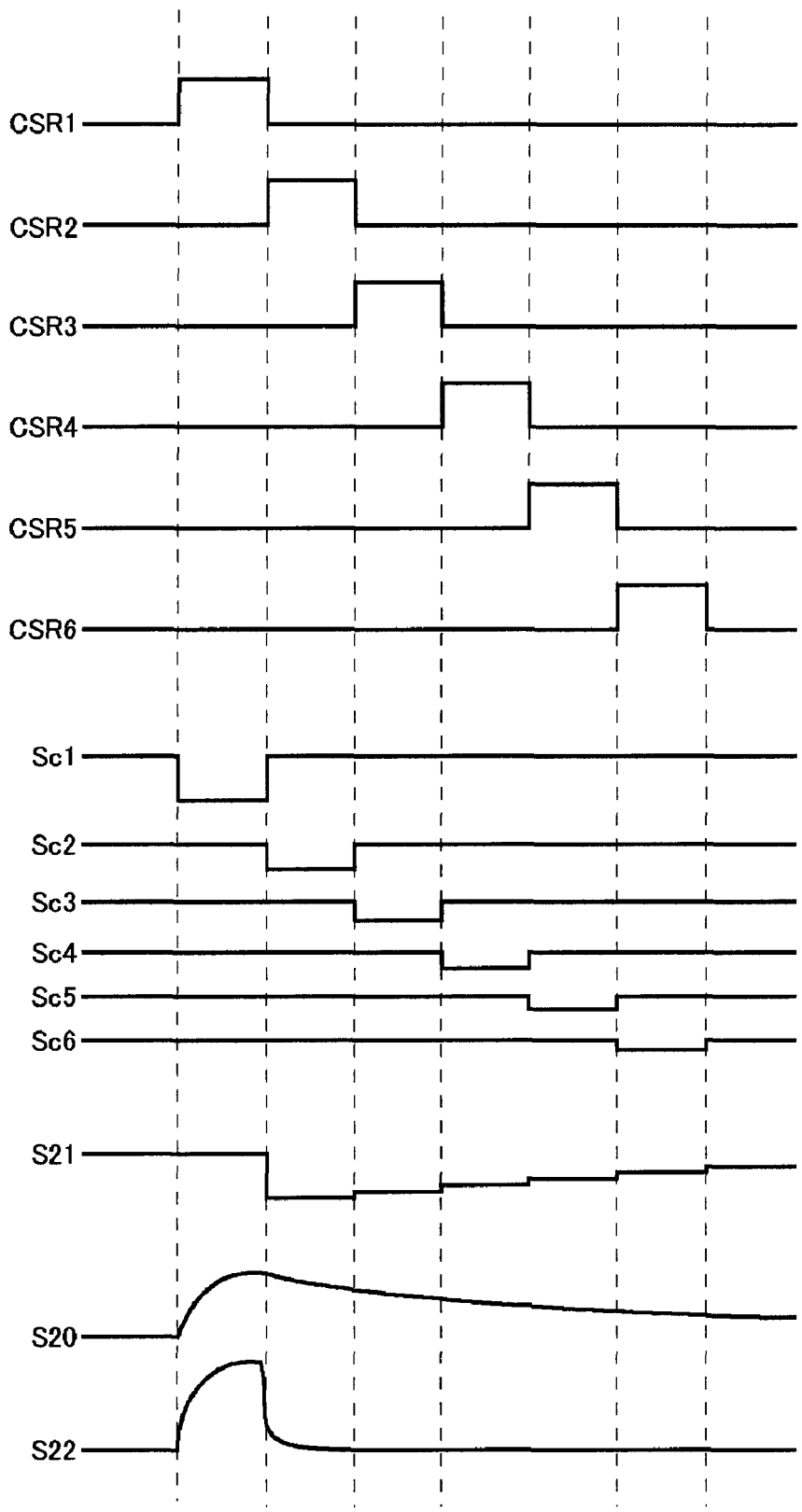
FIG. 9 is time charts illustrating an operation of the decision feedback equalizer in FIG. 8.

The structure of the second device 220a according to the variation has been described above. FIG. 9 is time charts illustrating an operation of the decision feedback equalizer 224a in FIG. 8. The time charts in FIG. 9 illustrate the case where the shift register 240 includes flip-flops with n of 6. By varying the gain (coefficient) of the variable gain amplifier in the weighting arithmetic circuit 244, each waveform of the signals Sc1 to Sc6 can be independently controlled, allowing the shape of the correction signal S21, which is a synthesized waveform, to be optionally controlled. By appropriately setting the shape of the correction signal S21 in accordance with the transmission loss, waveform regeneration can be performed.

The present invention has been described based on the embodiments, which is only intended to illustrate the principle and applications of the invention, and a variety of modifications and variations in arrangement may be made to the embodiments within the range not departing from the spirit of the invention specified in appended claims.

What is claimed is:

1. A method for testing a first device as a device under test in a state where the first device provided with a transmitter transmitting a signal and a second device provided with a receiver receiving the signal transmitted by the transmitter, are connected together, wherein the transmitter includes an equalizer circuit that shapes the waveform of a signal to be transmitted, and wherein the receiver includes a latch circuit that latches data corresponding to the signal thus received with the use of a clock, the timing of which is variable, and wherein the method comprises: outputting a signal corresponding to a pattern sequence by the transmitter; latching data corresponding to the signal at the clock edge by the latch circuit; and comparing the data latched by the latch circuit with an expected value corresponding to the pattern sequence, and the method being executed by varying, in a matrix, a parameter of the equalizer circuit and an edge timing of the clock supplied to the latch circuit.

2. The method according to claim 1 further comprising determining pass or fail of the first device based on comparison data indicating a comparison result acquired in a matrix.

3. The method according to claim 2, wherein the determining is based on a determination condition specified in association with the matrix.

4. A test apparatus in which a first device is tested as a device under test in a state where the first device provided with a transmitter transmitting a signal and a second device provided with a receiver receiving the signal transmitted by the transmitter, are connected together, wherein the transmitter includes an equalizer circuit that shapes the waveform of a signal to be transmitted, and wherein the receiver includes a latch circuit that latches data corresponding to the signal thus received with the use of a clock, the timing of which is variable, and wherein the test apparatus comprises: a socket board on which the first device and the second device are mounted; a transmission line that is formed on the socket board and connects the first device and the second device together; a control unit that controls operations of the first device and the second device and makes the latch circuit latch data corresponding to a signal corresponding to a pattern sequence while the signal is being outputted by the transmitter; and a data acquisition unit that acquires from the second device comparison data indicating a comparison result between the data thus latched and an expected value corresponding to the pattern sequence, and wherein the control unit varies, in a matrix, a parameter of the equalizer circuit and an edge timing of a clock supplied to the latch circuit.

5. The test apparatus according to claim 4 further comprising:
a determination unit that determines pass or fail of the first device based on the comparison data acquired in a matrix; and
an expected value holder that holds expected value data specified in association with the matrix as a determination condition to be referred when the determination unit determines pass or fail of the first device.

6. A method for testing a second device as a device under test in a state where a first device provided with a transmitter transmitting a signal and the second device provided with a receiver receiving the signal transmitted by the transmitter, are connected together, wherein the receiver includes an equalizing circuit that shapes the waveform of the signal thus received and a latch circuit that latches data corresponding to the signal thus received with the use of a clock, the timing of which is variable, and wherein the method comprises: outputting a signal corresponding to a pattern sequence by the transmitter; latching data corresponding to the signal at the clock edge by the latch circuit; and comparing the data latched by the latch circuit with an expected value corresponding to the pattern sequence, and the method being executed by varying, in a matrix, a parameter of the equalizing circuit and an edge timing of the clock supplied to the latch circuit.

7. The method according to claim 6 further comprising determining pass or fail of the second device based on comparison data indicating a comparison result acquired in a matrix.

8. The method according to claim 7, wherein the determining is based on a determination condition specified in association with the matrix.

9. A test apparatus in which a second device is tested as a device under test in a state where a first device provided with a transmitter transmitting a signal and the second device provided with a receiver receiving the signal transmitted by the transmitter, are connected together, wherein the receiver includes an equalizing circuit that shapes the waveform of the signal thus received and a latch circuit that latches data corresponding to the signal thus received with the use of a clock, the timing of which is variable, and wherein the test apparatus comprises: a socket board on which the first device and the second device are mounted; a transmission line that is formed on the socket board and connects the first device and the second device together; a control unit that controls operations of the first device and the second device and makes the latch circuit latch data corresponding to a signal corresponding to a pattern sequence while the signal is being outputted by the transmitter; and a data acquisition unit that acquires from the second device comparison data indicating a comparison result between the data thus latched and an expected value corresponding to the pattern sequence, and wherein the control unit varies, in a matrix, a parameter of the equalizer circuit and an edge timing of a clock supplied to the latch circuit.

10. The test apparatus according to claim 9 further comprising:
a determination unit that determines pass or fail of the second device based on the comparison data acquired in a matrix; and
an expected value holder that holds expected value data specified in association with the matrix as a determination condition to be referred when the determination unit determines pass or fail of the second device.

* * * * *